United States Patent
Estepa et al.

(10) Patent No.: US 6,969,638 B2
(45) Date of Patent: Nov. 29, 2005

(54) LOW COST SUBSTRATE FOR AN INTEGRATED CIRCUIT DEVICE WITH BONDPADS FREE OF PLATED GOLD

(75) Inventors: Erwin R. Estepa, Baguio (PH); Joel T. Medina, Baguio (PH); Maria Alesssandra Azurin, Braguio (PH); Kazuaki Ano, Hayami-gun (JP)

(73) Assignee: Texas Instruments Incorporated, Dallas, TX (US)

( * ) Notice: Subject to any disclaimer, the term of this patent is extended or adjusted under 35 U.S.C. 154(b) by 5 days.

(21) Appl. No.: 10/677,438

(22) Filed: Oct. 2, 2003

(65) Prior Publication Data

US 2005/0074920 A1 Apr. 7, 2005

Related U.S. Application Data

(60) Provisional application No. 60/483,457, filed on Jun. 27, 2003.

(51) Int. Cl.⁷ .......................... H01L 21/44; H01L 21/48; H01L 21/50
(52) U.S. Cl. ....................................... 438/115; 438/687
(58) Field of Search ............................. 438/15, 25, 51, 438/106, 115, 745, 687; 228/180.1, 180.21, 180.22, 203, 205, 206; 148/282; 324/755, 765

(56) References Cited

U.S. PATENT DOCUMENTS

| | | | | |
|---|---|---|---|---|
| 3,933,531 A | * | 1/1976 | Sawa et al. ................. 428/470 |
| 3,948,703 A | * | 4/1976 | Kushibe ..................... 216/106 |
| 4,714,517 A | * | 12/1987 | Malladi et al. ............... 216/34 |
| 5,071,520 A | * | 12/1991 | Lin et al. .................... 205/155 |
| 5,106,454 A | * | 4/1992 | Allardyce et al. ............. 216/20 |
| 5,304,252 A | * | 4/1994 | Condra et al. ................. 134/2 |
| 5,313,021 A | * | 5/1994 | Sajja et al. .................. 174/260 |
| 5,531,838 A | * | 7/1996 | Arldt et al. ................... 148/23 |
| 5,800,859 A | * | 9/1998 | Price et al. ................. 427/97.1 |
| 5,855,805 A | * | 1/1999 | Arabinick ................... 216/106 |
| 5,909,633 A | * | 6/1999 | Haji et al. ................... 438/612 |
| 5,960,251 A | * | 9/1999 | Brusic et al. ............... 428/551 |
| 6,335,104 B1 | * | 1/2002 | Sambucetti et al. ........ 428/615 |
| 6,358,847 B1 | * | 3/2002 | Li et al. ..................... 438/687 |
| 6,362,089 B1 | * | 3/2002 | Molla et al. ................ 438/612 |
| 6,367,150 B1 | * | 4/2002 | Kirsten ........................ 29/840 |
| 6,372,027 B1 | * | 4/2002 | Tomaiuolo et al. ...... 106/14.42 |
| 6,396,148 B1 | * | 5/2002 | Eichelberger et al. ...... 257/758 |
| 6,420,207 B1 | * | 7/2002 | Leuenberger et al. ....... 438/106 |
| 6,423,200 B1 | * | 7/2002 | Hymes ....................... 205/123 |
| 6,431,432 B1 | * | 8/2002 | McCormick et al. ....... 228/254 |
| 6,445,075 B1 | * | 9/2002 | Scanlan et al. ............. 257/778 |
| 6,476,491 B2 | * | 11/2002 | Harada et al. .............. 257/758 |
| 6,494,361 B1 | * | 12/2002 | Scanlan et al. ............. 228/223 |
| 6,552,430 B1 | | 4/2003 | Perez et al. |
| 6,562,149 B1 | * | 5/2003 | Grieser et al. .............. 148/270 |

(Continued)

*Primary Examiner*—Olik Chaudhuri
*Assistant Examiner*—Michael K. Luhrs
(74) *Attorney, Agent, or Firm*—Yingsheng Tung; Wade James Brady, III; Frederick J. Telecky, Jr.

(57) ABSTRACT

Disclosed herein is a process for assembling an integrated circuit, as well as the assembly resulting from the process, employing a surface treatment of bondpad surfaces. In one aspect, a method of assembling an integrated circuit includes providing a substrate having electrical terminals on a first side of the substrate and a bondpad on a second side of the substrate opposing the first side. In this embodiment, the bondpad is electrically coupled to at least one of the terminals on the first side. In addition, the method includes mounting an integrated circuit chip to the first side of the substrate, where the integrated circuit component has a lead adapted to be wire-bonded to the terminal. The method further includes removing oxidation from the bondpad, where the bondpad is adapted to be metallurgically bonded to a trace on a printed circuit board. Moreover, this embodiment of the method includes metallurgically bonding the bondpad to the trace.

17 Claims, 2 Drawing Sheets

FIG. 3B

U.S. PATENT DOCUMENTS

| | | | |
|---|---|---|---|
| 6,593,221 B1 * | 7/2003 | Lindgren | 438/612 |
| 6,696,757 B2 * | 2/2004 | Yunus et al. | 257/735 |
| 6,713,318 B2 * | 3/2004 | Maeda et al. | 438/108 |
| 6,800,555 B2 * | 10/2004 | Test et al. | 438/687 |
| 2002/0095783 A1 * | 7/2002 | Kirsten | 29/841 |
| 2003/0216025 A1 * | 11/2003 | Lu et al. | 438/614 |
| 2004/0087057 A1 * | 5/2004 | Wang et al. | 438/106 |
| 2004/0150105 A1 * | 8/2004 | Yunus et al. | 257/735 |

* cited by examiner

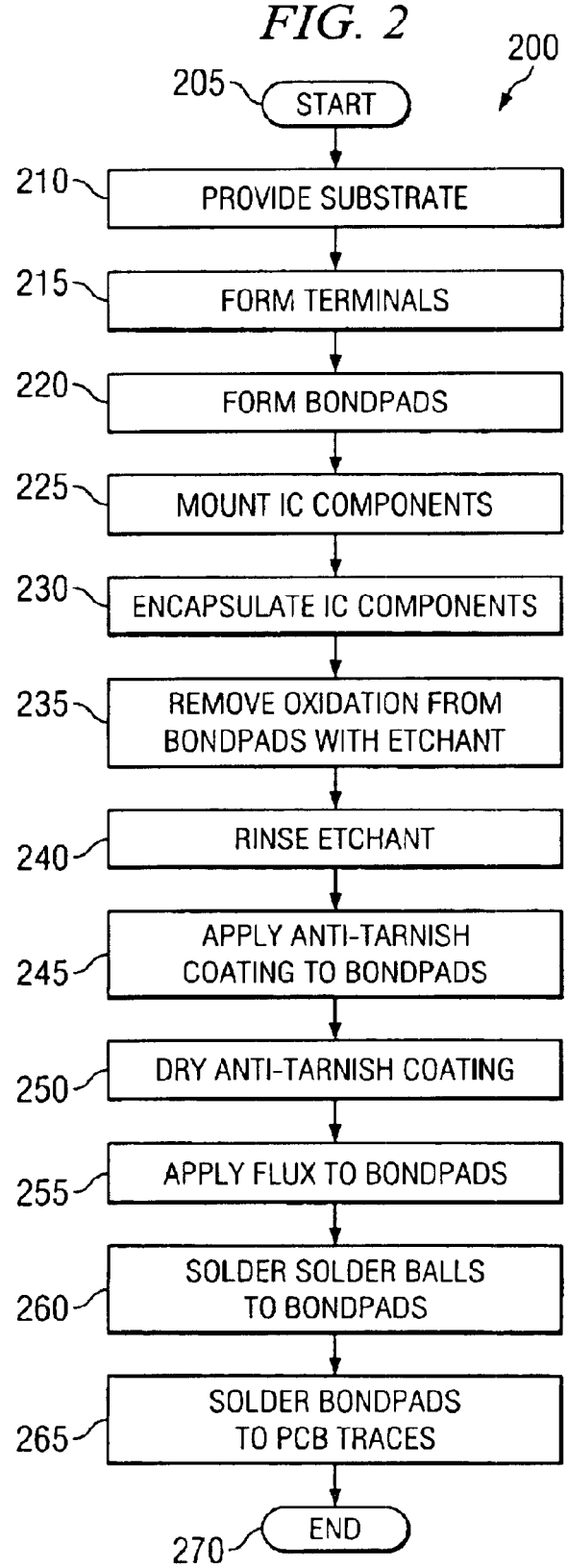

LOW COST SUBSTRATE FOR AN INTEGRATED CIRCUIT DEVICE WITH BONDPADS FREE OF PLATED GOLD

CROSS-REFERENCE TO RELATED APPLICATION

This Application claims the benefit of U.S. Provisional Application Ser. No. 60/483,457, filed on Jun. 27, 2003, which is commonly assigned with the present Application and incorporated herein by reference for all purposes.

TECHNICAL FIELD

Disclosed embodiments relate generally to integrated circuits, and more particularly to methods for assembling integrated circuit assemblies, as well as the resulting integrated circuit assemblies, by employing a surface treatment on bondpad surfaces prior to soldering terminals to the bondpads.

BACKGROUND

Integrated circuits (ICs) are usually formed on semiconductor wafers. The wafers are separated into individual dies or chips, and the individual chips are then handled and packaged. The packaging process is one of the most critical steps in the IC fabrication process, both from the point of view of cost and of reliability. For example, the packaging cost can easily exceed the cost of the IC chip itself. In addition, many of the device failures that occur are generally packaging related.

The IC chip should be packaged in a suitable medium that will protect it in subsequent manufacturing steps, as well as from the environment of its intended application. Wire-bonding and encapsulation are the two main steps employed in the packaging process. Wire-bonding connects the leads from the IC chip to terminals on one side of the package substrate. Following wire-bonding of the IC chip to the package substrate, encapsulation is employed to seal the surfaces from moisture and contamination and to protect the wire-bonding and other components from corrosion and mechanical shock.

The terminals to which the leads of the IC chip are wire-bonded are electrically coupled through the package substrate, using vias extending through the package substrate, to package bondpads on a second, opposing side of the package substrate. These bondpads on the package substrate allow the completed package to be connected to other components. Specifically, the exposed bondpads have a solder ball attached to them. As a result, an array of solder balls is formed on the bondpads so that the package may be electrically and mechanically coupled to other circuitry, generally through a printed circuit board (PCB), using the array of solder balls that is referred to as a ball grid array (BGA). When such a BGA is employed to connect the package, it may be referred to as a BGA package.

Unfortunately, the material typically used for the bondpads, for example, copper, oxidizes when remaining exposed throughout the assembly process, until the bondpads are soldered. Oxidation on the surface of the bondpads, as well as contaminants that may gather on the bondpad surface when exposed during the assembly process, often detrimentally affect the metallurgical bond between the bondpads and the corresponding traces on the PCB. Specifically, the dielectric nature of the oxidation may affect the electrical connection between the two, while in some cases also affecting the strength of the bond used to hold the IC package to the PCB. Problems with the electrical connections between the bondpads on the packages and PCBs, as well as the strength of the mechanical bond between the two, can often affect the overall operation and longevity of the assembly.

BRIEF SUMMARY

Disclosed herein is a process for assembling an integrated circuit, as well as the assembly resulting from the process, employing a surface treatment of bondpad surfaces. In one aspect, a method of assembling an integrated circuit includes providing a substrate having electrical terminals on a first side of the substrate and a bondpad on a second side of the substrate opposing the first side. In this embodiment, the bondpad is electrically coupled to at least one of the terminals on the first side. In addition, the method includes mounting an integrated circuit chip to the first side of the substrate, where the integrated circuit component has a lead adapted to be wire-bonded to the terminal. The method further includes removing oxidation from the bondpad, where the bondpad is adapted to be metallurgically bonded to a trace on a printed circuit board. Moreover, this embodiment of the method includes metallurgically bonding the bondpad to the trace.

In another aspect, an integrated circuit assembly is disclosed. In one embodiment, the assembly includes a substrate having electrical terminals on a first side thereof. The assembly also includes a bondpad on a second side of the substrate opposing the first side, where the bondpad is electrically coupled to at least one of the terminals. In addition, the assembly includes an integrated circuit chip mounted to the first side of the substrate, where the integrated circuit chip has lead adapted to be wire-bonded to the terminal. The assembly still further includes a solder joint metallurgically bonded to the bondpad and adapted to metallurgically bond the bondpad to a trace on a printed circuit board.

BRIEF DESCRIPTION OF THE DRAWINGS

Reference is now made to the following detailed description of the preferred embodiments, taken in conjunction with the accompanying drawings. It is emphasized that various features may not be drawn to scale. In fact, the dimensions of various features may be arbitrarily increased or reduced for clarity of discussion. In addition, it is emphasized that some components may not be illustrated for clarity of discussion. Reference is now made to the following description taken in conjunction with the accompanying drawings, in which:

FIG. 2 illustrates a flow diagram of one embodiment of a process for assembling an IC assembly, including performing the surface treatment of the bondpads disclosed herein;

DETAILED DESCRIPTION OF PREFERRED EMBODIMENTS

Figure 1:
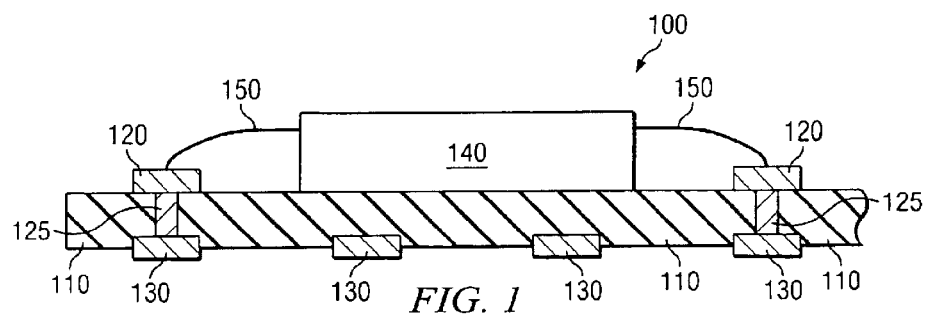
FIG. 1 illustrates an exploded isometric view of one embodiment of an integrated circuit assembly shown during manufacturing according to the principles disclosed herein.

Referring initially to FIG. 1, illustrated is a side view of one embodiment of an integrated circuit (IC) assembly 100 shown during a manufacturing process conducted according to the principles disclosed herein. The assembly 100 includes a package substrate 110, which may be formed from any appropriate dielectric material. In addition, the substrate 110 may include multiple layers for forming various electrical interconnects, and may be constructed using conventional techniques.

The IC assembly 100 further includes multiple electrical terminals (one of which is labeled 120) formed on a first side of the substrate 110. In an advantageous embodiment, the terminals 120 may be formed from copper, and may be electrically connected through the substrate 110 using vias 125. The IC assembly 100 further includes a plurality of package bondpads (one of which is labeled 130) formed on the second side of the substrate 110. As illustrated, various ones of the bondpads 130 are electrically interconnected to various ones of the terminals 120 through the vias 125. Typically, the bondpads 130 provide an electrically conductive surface through which the IC assembly 100 may be electrically coupled to a PCB (not illustrated) to form complete and functional circuitry.

Also in the illustrated embodiment, an IC chip 140 is mounted on the first side of the substrate 110. The IC chip 140 is mounted to the substrate 110 using leads (one of which is labeled 150) extending from the body of the IC chip 140. These leads 150 provide the electrical interconnection between the circuitry within the IC chip 140 and the substrate 110 to form an operative IC package assembly. More specifically, the leads 150 of the IC chip 140 are wire-bonded to the terminals 120 on the substrate 110, but other types of metallurgical bonding may also be employed. Once the chip 140 is mounted on the substrate 110, but before the soldering of the bondpads 130 to a PCB, the surface treatment provided by the principles disclosed herein is performed on the substrate 110. A specific example of the process employed for this surface treatment is illustrated and described with reference to FIG. 2.

Looking at FIG. 2, illustrated is a flow diagram 200 of one embodiment of a process for assembling an IC assembly, including performing the surface treatment disclosed herein. It should be understood that the process flow described with reference to FIG. 2 is only one example of a process conducted according to the principles disclosed herein, and other processes, while still conducted according to these principles and within the scope of the present disclosure, may include a greater or lesser number of steps. The process begins at a start block 205.

At block 210, a substrate is provided for the IC assembly. In one embodiment, the substrate is comprised of dielectric material and includes electrical interconnection in the form of vias through the substrate, as shown in FIG. 1. At block 215, electrical interconnects, such as the terminals 120 illustrated in FIG. 1, are formed on one side of the substrate to provide electrical interconnections from one side of the substrate to the other. As mentioned above, both the substrate and electrical interconnects may be formed using either conventional or later-developed techniques. Next, at block 220, bondpads are formed on the opposite side of the substrate as the terminals, and are electrically coupled to some of the terminals using the vias. Typically, the bondpads, as well as the terminals, are formed from copper to provide good electrical conduction throughout the IC assembly. Additionally, the bondpads may be formed at the same time as the terminals, using the same or similar techniques.

However, as mentioned above, while copper is an excellent electrical conductor, the exposed copper surface of the bondpads typically oxidizes when left exposed during the manufacturing process used to form the IC assembly and prepare it for mounting to a PCB. As the exposed surface of the bondpads oxidizes, the impurities and dielectric material that form during oxidation detrimentally affect the connection between traces on a PCB and the oxidized bondpad. Specifically, such oxidation or contamination may result in a weak metallurgical bond between the surface of the bondpad and the solder (e.g. solder balls) used to affix the bondpad to the PCB. Moreover, the oxidation may also affect the electrical connection between the bondpad and the trace on the PCB, possible affecting overall assembly operation. To combat such oxidation, conventional techniques typically plate copper bondpads with conductive metals that do not usually suffer from significant oxidation. For example, many current techniques plate the copper bondpads with nickel and/or gold soon after the formation of the bondpads. If such plating is delayed until later in the assembly process, the copper bondpads may begin to oxidize even before the plating can be done, which may detrimentally affect the plating itself. Thus, by plating the bondpads soon after formation, the plating used in conventional techniques typically prevents oxidation by covering the bondpads from exposure.

In contrast to such conventional techniques, the process disclosed herein can allow the bondpads to remain exposed during early stages of the process, alleviating the need to have a plating step during the manufacturing process. As such, at block 225, IC the substrate may simply be metallurgically bonded to the PCB without the need to divert the process to a plating step. In an exemplary embodiment, at block 230, the IC chips mounted on the substrate are encapsulated, in accordance with conventional techniques. Typically, such an encapsulation step promotes further oxidation of the copper bondpads due primarily to the extreme temperatures imparted on the assembly. However, since the novel process disclosed herein provides for the removal of oxidation from the surfaces of the bondpads before soldering, even after encapsulation, accelerated oxidation does not detrimentally affect the assembly process or the operation of the resulting IC assembly. Of course, encapsulation of various chips or other areas of the IC assembly need not be performed in order to enjoy the benefits provided by the surface treatment disclosed herein.

To begin the disclosed surface treatment, at block 235 oxidation formed on the surface of the bondpads is removed. In a particularly advantageous embodiment, the oxidation is removed using a solution having an etchant. In such an embodiment, the solution containing the etchant may be sprayed onto the bondpads during the assembly process, or the entire substrate may simply be submerged in a solution having an etchant. In an exemplary embodiment, the etchant comprises potassium peroxymonosulfate. In a more specific embodiment, the solution may be a water-based solution, and may include about 80 grams to about 120 grams of potassium peroxymonosulfate per liter of water. In another specific embodiment, the solution containing the etchant may also include about 1% to about 3% sulfuric acid per volume. In a related embodiment, the etchant solution is applied to the bondpads at about room temperature, however other temperatures may also be appropriate. At block 240, the solution having the etchant is rinsed from the substrate to prevent further etching of the materials thereon unnecessarily. In one embodiment, the etching solution is rinsed with deionized water, but other rinsing agents may also be employed.

In the exemplary embodiments discussed above, concentrations of the various compounds in the solution are selected to provide for the removal of oxidation from bondpads manufactured from copper. It should be understood, however, that bondpads formed from other oxidizing materials may require adjustments in these concentrations, as well as in saturation times and process temperatures. Such variations in the parameters of the process disclosed herein are readily determinable by persons skilled in the pertinent field of art for the present process, and remain within the broad scope of the disclosed process. As such, the novel surface treatment may be easily adapted for use with bondpads or other assembly portions that may be detrimentally affected by oxidation, which are constructed from materials other than copper, while still falling within the scope of the claims set forth herein.

Moving on to block 245, an anti-tarnish coating is applied to the substrate, to coat the freshly etched bondpad surfaces. Since the bondpads are constructed from material that oxidizes upon exposure to the elements, as mentioned above, applying an anti-tarnish coating to the etched surfaces of the bondpads is important, although not required, to prevent future oxidation of those surfaces. Like the solution containing the etchant, the anti-tarnish coating may be applied by spraying the substrate with a solution containing the anti-tarnish compound. Alternatively, the substrate may be submerged in an anti-tarnish solution to apply the anti-tarnish coating. In an exemplary embodiment, the anti-tarnish solution comprises methyl alcohol, benzotriazole, a nonionic surfactant, and water. In a more specific, but related, embodiment, the anti-tarnish solution comprises about 5% methyl alcohol, about 1% benzotriazole, about 3% nonionic surfactant, and about 91% water.

In other embodiments, the anti-tarnish solution may further comprise about 1% to about 2.5% sulfuric acid per volume. Of course, other mixtures and concentrations may be used to create the anti-tarnish solution. In yet another embodiment, the anti-tarnish coating may be formed over the surfaces of the bondpads using a process temperature of about 60° C. As with the removal of oxidation using a solution having an etchant, variations in the parameters of the application of the anti-tarnish coating may also be determinable by persons skilled in the pertinent field of art for the present process, depending on the materials involved and the results desired. However, such variations in parameters remain within the broad scope of the disclosed process. Moving on to block 250, the anti-tarnish coating formed on the surfaces of the bondpads is dried so the assembly may quickly move on in the assembly process. Such drying may be accomplished by blowing heated air over the substrates, or, alternatively, by exposing the substrates to an appropriate heat source. Of course, accelerated drying is not required, and the substrates may also simply be air-dried before moving on in the assembly process.

In the final stages of the assembly process disclosed in FIG. 2, the package substrate, with the optionally encapsulated IC chip, is prepared for being electrically coupled to corresponding traces on a PCB. More specifically, at block 255, a flux, for example, in the form of a paste, is applied to the surface of the bondpads. Advantageously, a flux may be selected to assist in the removal of the anti-tarnish coating from the surface of the bondpads during the soldering process. At block 260, solder balls are soldered to the various bondpads on the substrate to form a "ball grid array" for use in mounting the package to the PCB. Although solder balls having a spherical shape are discussed herein and illustrated in the figures, it should be understood that any type or shape of solder may be employed to form the solder joints, while remaining within the scope of this disclosure.

At block 265, the bondpads are soldered to the corresponding traces on the PCB by melting the solder balls on the bondpads so that they also metallurgically bond with the traces on the PCB. Once soldered to the PCB, the process ends at block 270.

Figure 3A:
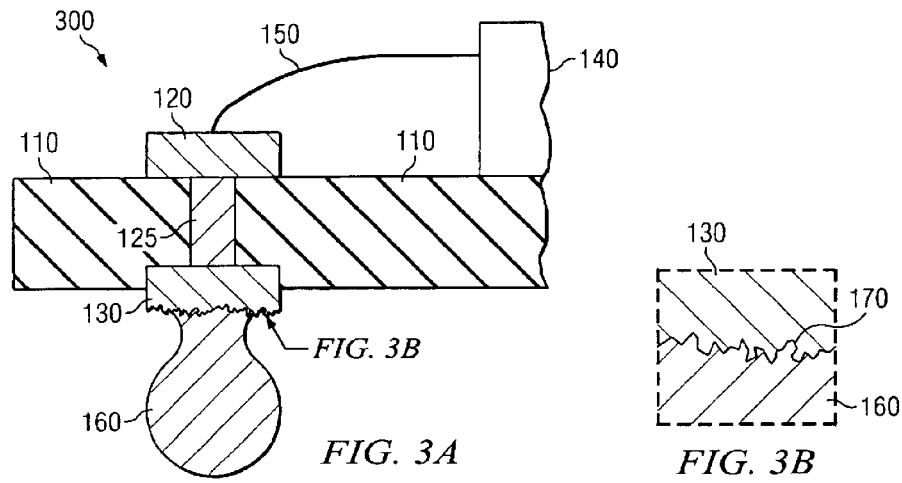
FIGS. 3A and 3B illustrate a sectioned view of a close-up of one of the metallurgical bonding points of the integrated circuit assembly shown in FIG. 1.

Turning now to FIG. 3A, illustrated is a side close-up view of a metallurgical bonding point 300 of the IC assembly 100 shown in FIG. 1, after the surface treatment is performed in accordance with the process disclosed in FIG. 2. The illustration of FIG. 3 includes the substrate 110 of FIG. 1, as well as one of the terminals 120 and one of the vias 125 extending through the various layers of the substrate 110. FIG. 3 also includes the IC chip 140 and one of the leads 150 extending therefrom and wire-bonded to the terminal 120, as well as one of the bondpads 130 discussed above.

The bonding point 300 also illustrates a solder ball 160, which is metallurgically bonded to the surface of the bondpad 130. In accordance with the process illustrated in FIG. 2, the solder ball 160 is formed after the surface treatment described above is performed on the surface of the bondpad 130. More specifically, plating is not used over the surface of the bondpad 130 during the manufacture of the IC assembly 100 to prevent oxidation of the bondpads, as is typically found in conventional processes. Instead, before the solder ball 160 is soldered to the bondpad 130, the oxidation is removed from the surface of the bondpad 130 using a solution having an etchant. Once the oxidation is removed, an anti-tarnish coating is provided over the freshly etched surface of the bondpad 130 to prevent future oxidation until the soldering is performed.

Figure 3B:
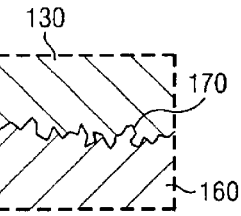

Yet another advantage to the surface treatment disclosed herein is the roughening of the surface of the bondpad 130 that typically occurs when the oxidation is removed using an etchant. As is well known, applying an etchant to a material typically results in a rough finish left on the surface of the material. As shown in FIG. 3B, which is a close-up view of the metallurgical bond between the bondpad 130 and solder ball 160, applying the etchant to the bondpad 130 not only removes the oxidation formed thereon, but also creates a rough surface 170 on the bondpad 130. By creating the rough surface 170, the melted solder in the solder ball 160 better adheres to the bondpad 130. With such better adherence, the strength and quality of the metallurgical bond between the bondpad 130 and the solder ball 160 may be increased. Such a robust bond may also increase the longevity of the IC assembly 100 by providing less of a chance of solder joint failure during the operational life of the assembly.

Figure 4:
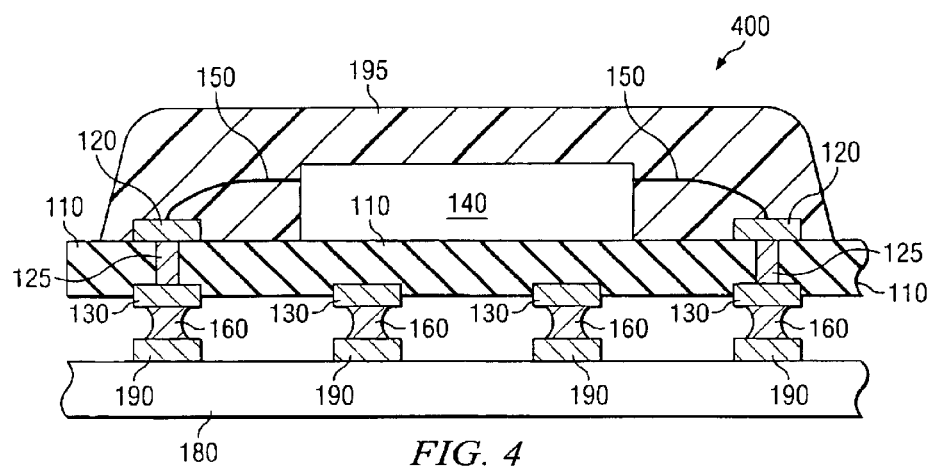
FIG. 4 illustrates a side view of a portion of a completed IC assembly constructed using a process employing the surface treatment disclosed herein.

Looking finally at FIG. 4, illustrated is a side view of a portion of a completed IC assembly 400 constructed using a process employing the principles of the surface treatment disclosed herein. The completed IC assembly 400 includes the substrate 110 and terminals 120 formed thereon discussed with reference to the figures above. In addition, the completed IC assembly 400 includes multiple bondpads 130 for affixing the entire package to the substrate 110. In addition, the IC chip 140 is shown wire-bonded to the terminals 120.

Also illustrated in FIG. 4, the entire IC package is shown metallurgically bonded to a PCB 180. More specifically, solder balls 160 bonded to the bondpads 130 are used to form solder joints to traces (one of which is labeled 190) located on the PCB 180 during a conventional soldering technique. Also illustrated in FIG. 4 is an encapsulating material 195 formed over the IC chip 140. As described above, the IC chip(s) 140 mounted on the substrate 110 may be encapsulated in order to help protect not only the electrical connections between the various IC chips 140 and terminals 120, but also to protect and hold the IC chips 140 themselves. Moreover, the encapsulating material 195 may be formed using any appropriate encapsulation technique, either presently known or later developed.

By employing the surface treatment disclosed herein, the costs associated with manufacturing IC assemblies may be significantly reduced. Specifically, as discussed above, conventional techniques typically deposit a plating material, such as nickel or gold, over the surface of IC bondpads in an effort to avoid the issues caused by oxidation of the bondpads during the remainder of the manufacturing process. In addition, other stages of the process, such as the encapsulation stage, may even promote increased oxidation due to the elevated temperatures involved. However, by employing the novel surface treatment disclosed herein, costly plating materials, as well as the time associated with completing the plating process, may be avoided altogether.

Moreover, even in processes incorporating plating of the bondpad surfaces, later stages of the manufacturing process may result in contaminants landing or forming on the outer surface of the plating, possibly detrimentally affecting the bonding of the bondpads to the traces on a PCB. Since the surface treatment provided herein is employed late in the manufacturing process, such contaminants that may be present, in addition to the oxidation, may also be removed from the bondpad surfaces during the surface treatment. Furthermore, by forming an anti-tarnish coating over the freshly etched bondpad surfaces, further oxidation or contamination of those surfaces may be prevented. Additionally, contaminants that may land or form on the outer surface of the anti-tarnish coating are simply removed when the anti-tarnish coating is removed with flux during the soldering process used to attach the solder balls. Still further, by employing an etchant in the surface treatment of the bondpads, the bondpad surfaces may be left with a rough finish, promoting the strength of the metallurgical bond created between the bondpad surfaces and the solder balls, which also promotes a better electrical connection between the bondpads and the PCB.

While various embodiments of the surface treatment according to the principles disclosed herein, as well as completed IC assemblies and methods of manufacturing incorporating the surface treatment, have been described above, it should be understood that they have been presented by way of example only, and not limitation. Thus, the breadth and scope of the invention(s) should not be limited by any of the above-described exemplary embodiments, but should be defined only in accordance with the following claims and their equivalents. Moreover, the above advantages and features are provided in described embodiments, but shall not limit the application of the claims to processes and structures accomplishing any or all of the above advantages.

Additionally, the section headings herein are provided for consistency with the suggestions under 37 CFR 1.77 or otherwise to provide organizational cues. These headings shall not limit or characterize the invention(s) set out in any claims that may issue from this disclosure. Specifically and by way of example, although the headings refer to a "Technical Field," the claims should not be limited by the language chosen under this heading to describe the so-called technical field. Further, a description of a technology in the "Background" is not to be construed as an admission that technology is prior art to any invention(s) in this disclosure. Neither is the "Brief Summary" to be considered as a characterization of the invention(s) set forth in the claims found herein. Furthermore, any reference in this disclosure to "invention" in the singular should not be used to argue that there is only a single point of novelty claimed in this disclosure. Multiple inventions may be set forth according to the limitations of the multiple claims associated with this disclosure, and the claims accordingly define the invention(s), and their equivalents, that are protected thereby. In all instances, the scope of the claims shall be considered on their own merits in light of the specification, but should not be constrained by the headings set forth herein.

What is claimed is:

1. A method of assembling an integrated circuit (IC) device with a substrate, comprising:
   providing a substrate having electrical terminals on a first side of the substrate, and a copper bondpad on a second side of the substrate opposing the first side electrically coupled to at least one of the terminals;
   the copper bondpad being substantially free of plated gold and substantially free of solder material;
   mounting the IC chip to the first side of the substrate;
   electrically connecting the IC chip to the terminals;
   encapsulating the IC chip mounted on the substrate with encapsulation material at an elevated temperature, thereby oxidizing the surface of the copper bondpad;
   spraying an aqueous etchant on the bondpad to remove oxidized copper from the bondpad; and
   coating the etched bondpad with an anti-tarnish solution.

2. The method according to claim 1, further comprising rinsing the etchant with deionized water.

3. The method according to claim 1, wherein the etchant comprises potassium peroxymonosulfate.

4. The method according to claim 3, wherein the etchant comprises from about 80 grams to about 120 grams of potassium peroxymonosulfate per liter of water.

5. The method according to claim 4, wherein the etchant further comprises from about 1% to about 3% sulfuric acid by volume.

6. The method according to claim 5, wherein the spraying an aqueous etchant is performed at about room temperature.

7. The method according to claim 1, further comprising removing the anti-tarnish coating from the bondpad.

8. The method according to claim 1, wherein the anti-tarnish solution comprises methyl alcohol, benzotriazole, a nonionic surfactant, and water.

9. The method according to claim 8, wherein the anti-tarnish solution comprises about 5% methyl alcohol, about 1% benzotriazole, about 3% nonionic surfactant, and about 91% water.

10. The method according to claim 9, wherein the anti-tarnish solution further comprises from about 1% to about 2.5% sulfuric acid by volume.

11. The method according to claim 10, wherein the coating is performed at a temperature of about 60° C.

12. The method according to claim 1, further comprising metallurgically bonding the bondpad to a PCB using a solder ball.

13. A method of forming an integrated circuit (IC) device with an improved substrate, comprising:
   providing a substrate having terminals on a first side and copper bondpads on a second side, the outer surface of the copper bondpads substantially free of plated gold, substantially free of plated nickel, and substantially free of solder material;
   attaching an integrated circuit chip on the first side and electrically connecting the chip to the terminals;

encapsulating the circuit chip attached to the substrate with encapsulation material at an elevated temperature thereby oxidizing the surface of the copper bondpads;

submerging the substrate with the encapsulated IC chip in an aqueous etchant to remove oxidized copper from the bondpads; and coating the etched bondpads with an anti-tarnish solution.

14. The method of claim 13, further comprising mounting the IC device on a PCB.

15. The method of claim 13, further comprising electrically connecting the bondpads to conductive traces on the PCB.

16. The method of claim 15, in which the connecting further comprising applying solder material to the bondpads.

17. The method of 16, further comprising removing the anti-tarnish coating prior to applying solder material to the bondpads.

* * * * *